United States Patent
Hemley et al.

(10) Patent No.: US 9,023,306 B2
(45) Date of Patent: *May 5, 2015

(54) ULTRATOUGH SINGLE CRYSTAL BORON-DOPED DIAMOND

(75) Inventors: Russell J. Hemley, Washington, DC (US); Ho-Kwang Mao, Washington, DC (US); Chih-Shiue Yan, Washington, DC (US); Qi Liang, Washington, DC (US)

(73) Assignee: Carnegie Institution of Washington, Washington, DC (US)

( * ) Notice: Subject to any disclaimer, the term of this patent is extended or adjusted under 35 U.S.C. 154(b) by 389 days.

This patent is subject to a terminal disclaimer.

(21) Appl. No.: 12/435,565

(22) Filed: May 5, 2009

(65) Prior Publication Data

US 2010/0123098 A1 May 20, 2010

Related U.S. Application Data

(60) Provisional application No. 60/071,524, filed on May 5, 2008.

(51) Int. Cl.
| | |
|---|---|
| *B01J 3/06* | (2006.01) |
| *B01J 3/08* | (2006.01) |
| *C30B 23/00* | (2006.01) |
| *C30B 25/00* | (2006.01) |
| *C30B 28/12* | (2006.01) |
| *C30B 28/14* | (2006.01) |
| *C23C 16/27* | (2006.01) |
| *C30B 25/16* | (2006.01) |

(Continued)

(52) U.S. Cl.
CPC .............. *C23C 16/278* (2013.01); *C30B 25/165* (2013.01); *C30B 23/00* (2013.01); *C30B 25/16* (2013.01); *C30B 25/00* (2013.01); *C23C 16/274* (2013.01); *C30B 25/105* (2013.01); *C30B 29/04* (2013.01)

(58) Field of Classification Search
CPC ...... C30B 25/16; C30B 25/165; C30B 25/20; C30B 25/00; C30B 29/04; C30B 25/18; C01B 31/06

See application file for complete search history.

(56) References Cited

U.S. PATENT DOCUMENTS

| | | | |
|---|---|---|---|
| 5,541,423 A | 7/1996 | Hirabayashi | 257/77 |
| 5,981,057 A | 11/1999 | Collins | 428/334 |
| 6,322,891 B1 | 11/2001 | Meng et al. | 428/402 |

(Continued)

FOREIGN PATENT DOCUMENTS

| | | | |
|---|---|---|---|
| EP | 0390209 A3 | * | 1/1991 |
| WO | 2006/127611 A2 | | 11/2006 |
| WO | 2007/081492 A2 | | 7/2007 |

OTHER PUBLICATIONS

Lewis et al.; Optical-Quality Diamond Growth From CO2-Containing Gas Chemistries; Diamond and Related Materials; 8, 236-241; 1999.*

(Continued)

*Primary Examiner* — Guinever Gregorio
(74) *Attorney, Agent, or Firm* — Morgan Lewis & Bockius LLP

(57) ABSTRACT

The invention relates to a single crystal boron doped CVD diamond that has a toughness of at least about 22 MPa m$^{1/2}$. The invention further relates to a method of manufacturing single crystal boron doped CVD diamond. The growth rate of the diamond can be from about 20-100 µm/h.

6 Claims, 8 Drawing Sheets

(51) Int. Cl.
*C30B 25/10* (2006.01)
*C30B 29/04* (2006.01)

(56) References Cited

U.S. PATENT DOCUMENTS

| | | | |
|---|---|---|---|
| 6,858,078 B2 | 2/2005 | Hemley et al. | 117/68 |
| 7,115,241 B2 | 10/2006 | Hemley et al. | 423/446 |
| 7,157,067 B2 | 1/2007 | Hemley et al. | 423/446 |
| 7,160,617 B2 | 1/2007 | Scarsbrook et al. | 428/408 |
| 7,201,886 B2 | 4/2007 | Linares et al. | 423/446 |
| 7,883,684 B2 * | 2/2011 | Hemley et al. | 423/446 |
| 2005/0066884 A1* | 3/2005 | Linares et al. | 117/68 |
| 2005/0109266 A1 | 5/2005 | Linares et al. | 117/68 |
| 2005/0139150 A1* | 6/2005 | Meguro et al. | 117/89 |
| 2006/0065187 A1* | 3/2006 | Hemley et al. | 117/104 |
| 2007/0051300 A1 | 3/2007 | Bhandari | |
| 2007/0077192 A1 | 4/2007 | Hemley et al. | 423/446 |
| 2007/0196263 A1* | 8/2007 | Hemley et al. | 423/446 |
| 2008/0003447 A1 | 1/2008 | Nee | 428/615 |

OTHER PUBLICATIONS

Yoshida et al.; Effect of Oxygen Addition on Microwave Plasma CVD of Diamond from CH4—H2 mixture; Materials Research Bulletin; vol. 24, Issue 1, pp. 87-94; 1989.*
Lewis et al.; Optical-Quality Diamond Growth from CO2 Containing Gas Chemistries; Diamond and Related Materials; vol. 8, pp. 236-241; 1999.*
PCT International Search Report, dated Aug. 12, 2009.
Anderson et al., "The effect of carbon and nitrogen implantation on the abrasion resistance of type IIa(110) diamond", Nucl. Methods Phys. Res. B 80-81, 1451 (1993).
Anstis et al., "Critical Evaluation of Indentation Techniques for Measuring Fracture Toughness: I, Direct Crack Measurements", J. Am. Ceram. Soc. 64, 533 (1981).
Anthony et al., "Stresses generated by inhomogeneous distributions on inclusions in diamonds", Diam. Rel. Mater. 6, 120 (1997).
Arima et al., "Effects of vicinal angles from (0 0 1) surface on the Boron-doping features of high-quality homoepitaxial diamond films grown by the high-power microwave plasma chemical-vapor-deposition method", J. Crys. Growth, 309, pp. 145-152 (2007).
Brazhkin et al., "From our readers: What does 'harder than diamond' mean?" Nature Materials, 3(9), 576 (2004).
Burns "Growth-Sector Dependence of Optical Features in Large Synthetic Diamonds", Journal of Crystal Growth, J. Cryst. Growth, 104, 257-279 (1990).
Charles et al., "Characterization of nitrogen doped chemical vapor deposited single crystal diamond before and after high pressure, high temperature annealing", Phys. Stat. Sol., 201(11), 2473-2485 (2004).
Cheesman et al., "Computational studies of elementary steps relating to boron doping during diamond chemical vapour deposition", Phys. Chem. Chem. Phys., 7, 1121-1126 (2005).
Chrenko et al., "Boron, the Dominant Acceptor in Semiconducting Diamond", Physical Review, 7(10), 456-4567, (1973).
Davies et al., "The toughness of free-standing CVD diamond", J. Mater. Sci., 39(5), 1571-1574 (2004).
Drory et al., "Fracture of Synthetic Diamond", Appl. Phys. Lett, 78, 3083 (1995).
Gheeraert et al., "Boron-related infra-red absorption in homoepitaxial diamond films", Diamond and Relat. Mater., 7, 1509 (1998).
Jiang et al., "Accurate measurement of fracture toughness of free standing diamond films by three-point bending tests with sharp pre-cracked specimens", Diam. Rel. Mater., 9, 1734-1738 (2000).
Liang et al., "Effect of nitrogen addition on the morphology and structure of boron-doped nanostructured diamond films", Appl. Phys. Lett., 83, 5047 (2003).
Liang, C.S. Yan, Y.F. Meng, J. Lai, S. Krasnicki, H.K. Mao and R.J. Hemley, "Enhancing the Mechanical properties of Singe-crystal CVD diamond", J. Phys. Condens. matter 21 (2009) 364215 (6pp).
Liang et al., "Enhanced growth of high quality single crystal diamond by microwave plasma assisted chemical vapor deposition at high gas pressures", Appl. Phys. Lett., 94, 024103 (2009).
Locher R, Wagner J., Fuchs F., Maier M., Gonon P., Koidl P., Diamond Relat. Mater. 4, 678 (1995).
Martineau et al., "Identification of synthetic diamond grown using chemical vapor deposition (CVD)", Gems & Gemology, 60, 2-25 (2004).
Meng et al., "From the Cover: Enhanced optical properties of chemical vapor deposited single crystal diamond by low-pressure/high-temperature annealing", Proc. Nat. Acad. Sci. U.S.A. 105(46), 17620 (2008).
Miyata et al., "Morphology of heavily B-doped diamond films", J. Mater. Res., 8(11), 2845-2857 (1993).
Mora et al., "Direct evidence of interaction between dislocations and point defects in diamond", Phys. Stat. Sol., 202, R69-R71 (2005).
Novikov et al., J. Hard. Mater., "High-temperature toughness of monocrystalline diamonds", 4(1), 19-27 (1993).
Novikov et al., "Mechanical properties of diamond and cubic BN at different temperatures and deformation rates", Diam. Rel. Mater., 2, 1253-1256 (1993).
Patridge et al., "Potential for diamond fibres and diamond fibre composites", Materials Science and Technology, 10, 505-512 (1994).
Quinn et al., "On the Vickers Indentation Fracture Toughness Test", J. Am. Ceram. Soc. 90(3), 673 (2007).
Show et al., "changes in CVD diamond film by boron and nitrogen doping", Diamond Relat. Mater., 9, pp. 337-340 (2000).
Sumiya et al., "Indentation hardness of nano-polycrystalline diamond prepared from graphite by direct conversion", Diam. Rel. Mater., 13(10), 1771-1776 (2004).
Telling et al., "Theoretical Strength and Cleavage of Diamond", Phys Rev. Lett.,84, 5160-5163 (2000).
Vornov et al., Neorganicheskie Materialy, 29(5), pp. 543 (1993).
Wentorf et al., "Sintered Superhard Materials", Science, 208(4446), 873-880 (1980).
Yan et al., "Very high growth rate chemical vapor deposition of single-crystal diamond", Proceedings of the National Academy of Science, 99 (20), R25-R27 (2002).
Yan et al., "Ultrahard diamond single crystals from chemical vapor deposition", Phys. Stat. Sol 201(4), R25-R27 (2004).
Yan et al., "Very high growth rate chemical vapor deposition of single-crystal diamond", Proceedings of the National Academy of Science, 99, 12523-12525 (2002).
Extended European Search Report dated Feb. 6, 2014 in corresponding European Patent Application No. 09743007.8.

* cited by examiner

ULTRATOUGH SINGLE CRYSTAL BORON-DOPED DIAMOND

This application claims the benefit of U.S. Provisional Application No. 60/071,524, filed May 5, 2008, hereby incorporated by reference in its entirety.

STATEMENT OF GOVERNMENT INTEREST

This invention was made with U.S. government support from the National Science Foundation and the U.S. Department of Energy. The U.S. government has certain rights in the invention.

BACKGROUND OF THE INVENTION

1. Field of the Invention

The present invention relates generally to single crystal diamond manufactured by chemical vapor deposition (CVD). More specifically, the invention is concerned with high quality, ultratough single crystal CVD diamond doped with boron. The invention also relates to methods of manufacturing the same.

2. Description of Related Art

The fabrication of high quality single-crystal CVD diamond (SC-CVD) produced at high growth rates has drawn considerable attention (Yan et al., Proc. Nat. Acad. Sci., 2002; Liang et Phys. Lett., 2009). This diamond material can be produced to exhibit a range of optical and mechanical properties, either by optimizing the CVD growth or by post-growth treatment. Specifically, the hardness of the SC-CVD can be significantly enhanced by high-pressure/high-temperature (HPHT) annealing (Yan et al., Phys. Stat. Sol., 2004). This treatment also reduces the measured fracture toughness and provides a means by which to tune the hardness/toughness. Whereas diamond is the hardest material currently known, diamond is also brittle, which limits certain scientific and technological applications. Efforts have been taken to improve the fracture toughness diamond by making diamond/metal composites (Wentorf et al., Science, 1980) and by generating multi-structured diamond material (Anthony et al., Diam. Rel. Mater., 1997).

Diamond has been acknowledged as the hardest material known to man; the intrinsic hardness for natural single crystal diamond is around 100 GPa. As noted above, however, diamond is also known as a brittle material. It has been reported that fracture toughness ($K_{1C}$) for type Ia diamond is between 7.0 and 8.4 MPa m$^{1/2}$; for type IIa diamond, $K_{1C}$ is 4.2-5.6 MPa m$^{1/2}$ (Novikov et al., J. Hard Mater., 1993; Patridge et al., Materials Science and Technology, 1994).

Improvement in growing single crystal CVD diamond (SC-CVD) by MPCVD (Microwave Plasma assisted Chemical Vapor Deposition) process has enabled the fabrication of large size (over 3 ct as commercially available HPHT synthetic Ib diamond), high quality diamonds (Yan et al. Physica. Status. Solidi., 2004; Yan et al., Proceedings of the National Academy of Science, 2002). A gas chemistry including $H_2/CH_4/N_2/O_2$ has been used in the MPCVD process for diamond growth. The (100) growth was significantly enhanced by varying the growth conditions (including substrate temperature, pressure, $N_2$ and $O_2$ flow rate) and the color of the SC-CVD ranges from dark brown, to light brown, to near colorless, to colorless. Ultra high hardness (>150 GPa) and toughness (>30 MPa m$^{1/2}$) have been reported for such crystals (Yan et al., Physica. Status. Solidi., 2004).

It has also been reported that boron can be preferentially incorporated in the (111) sector in both gem diamonds (Burns et al., J. Cryst. Growth, 1990) and CVD diamond (Miyata et al., J. Mater. Res., 1993). Substitutional boron can expand the diamond lattice by 33.7%, and its solubility in diamond can be as much as 0.9% (Vornov et al. Neorganicheskie Materialy, 1993; Arima et al., J. Crys. Growth, 2007). Boron doped single crystal diamond has been produced by HPHT and CVD processes; however, type IIb diamond with large size (thicker than 2 mm) has not been reported.

U.S. Pat. No. 5,981,057 is directed to a CVD diamond layer containing boron dopant atoms in a concentration of at least 0.05 atomic percent. The diamond layer has an average tensile rupture strength of at least 600 MPa with the nucleation face in tension, and at least 300 MPa with the growth face in tension. Both tensile rupture strengths were measured by a three point bend test on a sample 11 mm in length, 2 mm in width, and with a thickness of 1.4 mm or smaller.

U.S. Pat. No. 7,201,886 is directed to a diamond tool comprising a shaped diamond having at least one layer of single crystal diamond heavily doped to create a visible color. The dopant can be boron.

U.S. Pat. No. 7,160,617 relates to a layer of single crystal boron doped diamond produced by CVD and having a total boron concentration which is uniform.

U.S. Pat. No. 6,858,078 to Hemley et al., which is incorporated herein by reference, is directed to an apparatus and method for diamond production. The disclosed apparatus and method can lead to the production of diamonds that are light brown to colorless.

U.S. patent application Ser. No. 10/889,171, which is incorporated herein by reference, is directed to annealing single-crystal chemical vapor deposition diamonds. Important inventive features include raising the CVD diamond to a set temperature of at least 1500° C. and a pressure of at least 4.0 GPa outside of the diamond stable phase.

U.S. patent application Ser. No. 10/889,170, U.S. Pat. No. 7,115,241, which is herein incorporated by reference, is directed to diamonds with improved hardness. The application discloses a single-crystal diamond with a hardness greater than 120 GPa.

U.S. patent application Ser. No. 10/889,169, now U.S. Pat. No. 7,157,067, which is herein incorporated by reference, is directed to diamonds with improved toughness. The application discloses a single-crystal diamond with a fracture toughness of 11-20 MPam$^{1/2}$ and a hardness of 50-90 GPa.

U.S. application Ser. No. 11/222,224, which is incorporated by reference, is directed to an annealed single crystal CVD diamond having a high toughness.

The cited references do not relate to single crystal boron-doped CVD diamond that is exceedingly tough. High toughness is a desired quality in single crystal diamond for uses including, but not limited to, micro- and nanomachining and rock drilling. Accordingly, there is an unfulfilled need for single crystal diamond that has a high toughness. Additionally, there is a real need for highly tough single crystal diamond with tunable characteristics, including, but not limited to, color. It is therefore a principal object of this invention to provide such highly tough diamond. Other objects will also be apparent from the detailed description of the invention which follows.

SUMMARY

The invention achieves its objective in part through the incorporation of boron into the diamond. Broadly stated, the present invention relates to a single-crystal boron-doped diamond grown by microwave plasma chemical vapor deposition that has a toughness of at least about 22 MPa m$^{1/2}$.

Broadly stated, the method for growing single-crystal boron doped diamond of high toughness can include the following steps:
  i) placing a seed diamond in a heat sink holder made of a material that has a high melting point and high thermal conductivity to minimize temperature gradients across the growth surface of the diamond;
  ii) controlling the temperature of a growth surface of the diamond such that the temperature of the growing diamond crystals is in the range of about 900-1500° C.; and
  iii) growing single-crystal diamond by microwave plasma chemical vapor deposition on the growth surface of a diamond in a deposition chamber 5-20% $CH_4/H_2$, 5-20% $O_2/CH_4$, 0-20% $N_2/CH_4$ and a source of boron. The growth rate for such diamond is from 20-100 μm/h.

In one aspect, the invention embraces single-crystal boron-doped diamond grown by microwave plasma chemical vapor deposition that has a toughness of at least about 22 MPa $m^{1/2}$. In another aspect, the hardness can be greater than about 60 GPa.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Figure 1:
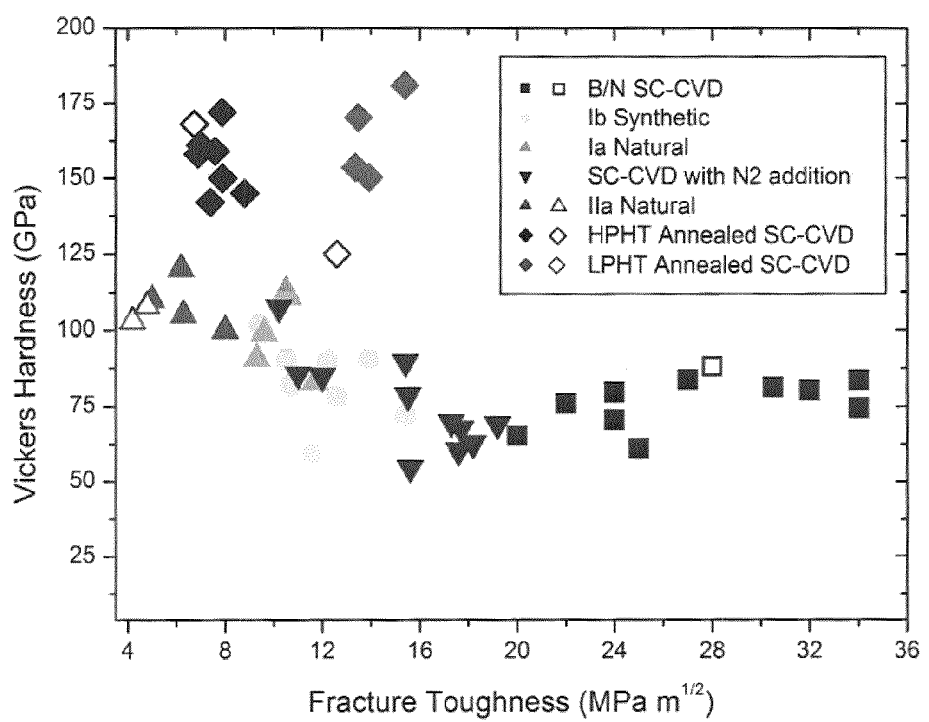
FIG. 1 provides a Vickers Hardness vs. Fracture Toughness Plot for natural Ia, IIa, Ib, CVD single crystal and CVD boron doped single crystal diamonds.

The present invention relates to further improvements in mechanical properties of single-crystal diamond fabricated by microwave plasma assisted chemical vapor deposition at high growth rates. Such further improvements can be observed after boron and/or nitrogen doping. Additional improvements can be observed when boron/nitrogen doping is performed in conjuction with low pressure/high temperature (LPHT) annealing, which is the subject of U.S. patent application Ser. No. 12/244,053 and U.S. Provisional Application No. 61/108,283, both of which are incorporated herein by reference. Boron/nitrogen incorporation can dramatically increase the toughness of single-crystal CVD diamond, leading to a material that can be termed ultratough. The LPHT annealing can enhance intrinsic hardness of this diamond by a factor of two without appreciable loss in fracture toughness. This doping and post-growth treatment of diamond may lead to new technological applications that require enhanced mechanical properties of diamond.

Various boron containing single crystal diamonds were synthesized by high density MPCVD at 5-20% $CH_4/H_2$, 5-20% $O_2/CH_4$, 0-20% $N_2/CH_4$, 100-400 Torr, and at temperatures ranging from 900° C. to 1500° C. It must be noted that other gases can be substituted for $O_2$, such other gases containing oxygen within the molecule. Examples include carbon dioxide, carbon monoxide and water vapor. Boron can be added to the chemistry using any chemical compounds which include boron; other atoms within the molecule can include one or more of nitrogen, carbon, hydrogen and oxygen atoms in any phase. Examples of boron-containing compounds which can be effectively introduced into the CVD reaction chamber include, but are not limited to, diborane ($B_2H_6$) or Trimethyl Borate (TMB) gases, vaporized $B_2O_3$, or hexagonal boron nitride powder. The decomposition of these compounds in the plasma system will supply a sufficient amount of boron to the doping process. Analogous to that of diamond formation by $CH_X$ species in a hydrogen rich CVD process, reactions between boron and hydrogen create a copious amount of $BH_X$ (X=0-3). The rapid interconversion reactions of $BH_X + H \leftrightarrow BH_{X-1} + H_2$ (X=0-3) will produce a sufficient amount of BH species which can be inserted into diamond structure (Cheesman et al., Phys. Chem. Chem. Phys., 2005). The doping level can be adjusted by:
  1) A change in the amount of boron dopant in the reaction;
  2) A change in nitrogen feed gas (Liang et al., Appl. Phys. Lett., 2003);
  3) Variation of the off-angle, which can also change boron incorporation level—boron incorporation level is different for each lattice plane: (111)>(110)>(100)=(113) (Burns et al., J. Cryst. Growth, 1990; FIG. 27); i.e., angle off (110) direction has more boron incorporation than angle off (100); and
  4) A change in the substrate temperature during diamond growth.

Substrates used to make the diamond of the invention were natural Ia or IIa, HPHT synthetic Ib, or SC-CVD with (100) surfaces. The top growth surface can be slightly off (100) plane, preferably between 0 and 20 degrees, and more preferably between 0-15 degrees. With an off axis angle lower than 1 degree, octahedral diamond with (111) faces begins to form, and (100) preferred growth can not continue. The growth layer can not be thicker than 100 microns. With an off axis angle higher than 20 degree, isolated (100) columns and steps will take place. Off angles between 1 and 20 degrees will generate a smooth step flow morphology free of hillocks, hence enlarging the single crystal diamond. A growth rate of 20-100 μm/h was recorded, which is a 10-100 times improvement compared with other B doped single crystal diamond growth (Arima et al, J. Crys. Growth, 2007).

Figure 3:
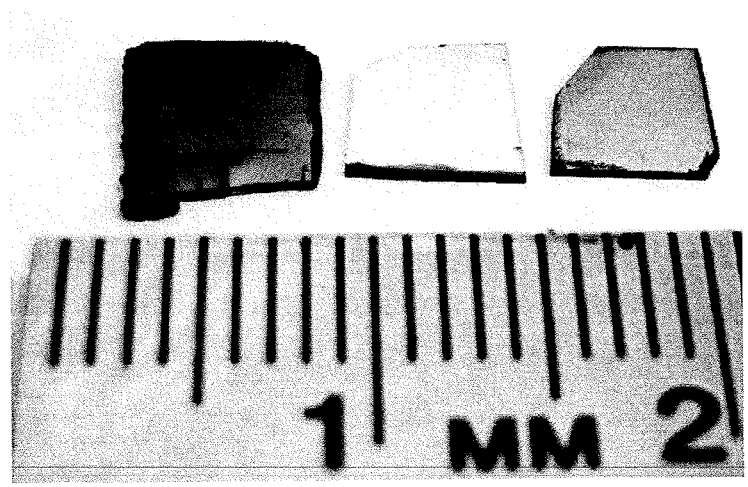
FIG. 3 provides pictures of light brown, colorless, and faint blue boron doped SC-CVD diamonds.

By varying the process parameters (including, but not limited to, $N_2$ feed gas rate, B dopant amount, off angle and surface temperature) and consequently varying the boron and nitrogen content, the color of the boron doped SC-CVD is tunable from dark brown, light brown, near colorless, colorless, faint blue to dark blue. FIG. 3 shows three samples with colors of (a) light brown, (b) colorless, and (c) faint blue.

Figure 4:
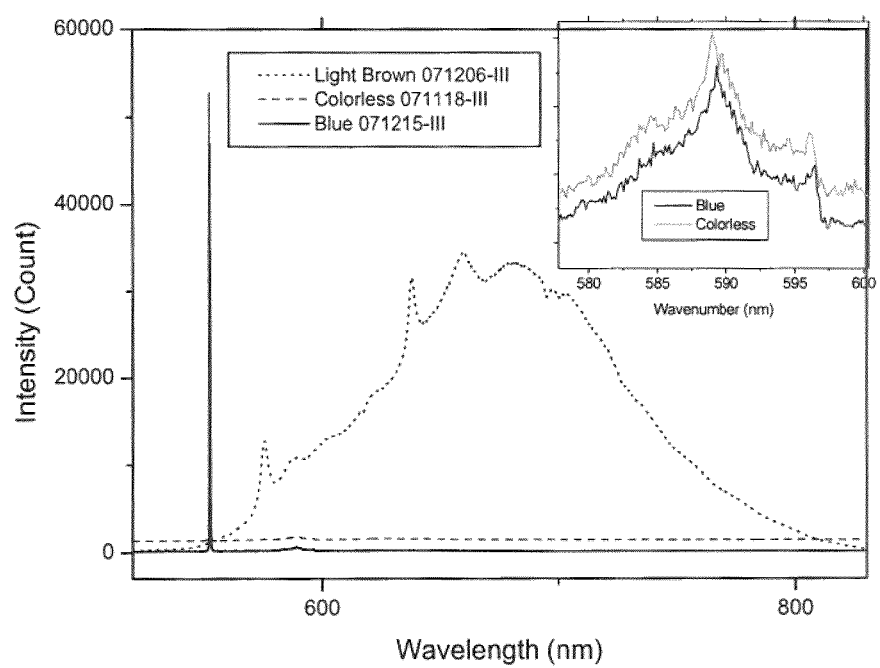
FIG. 4 provides photoluminescence spectra for light brown, colorless and faint blue boron doped SC-CVD diamonds.

The photoluminescence spectra for samples a through c excited at 514 nm laser is shown in FIG. 4. Compared with CVD diamond without boron, CVD diamond with boron incorporation can improve the diamond quality and minimize diamond defects (Chrenko, Physical Review B, 1973; Show et al., Diamond Relat. Mater., 2000; Locher et al., Diamond Relat. Mater., 1995). Nitrogen-vacancy (N-V) centers might or might not exist for boron doped diamonds. For tough and ultratough boron doped diamond single crystal diamond, the ratio of $I_{NV@575\ nm}/I_{D@551\ nm}$ varies between 0 and 100/1. The color grading of boron doped single crystal diamonds sits between D and Z on Diamond Color Grading Scales. Introducing boron can completely eliminate the incorporation of silicon in diamond structure, as evidenced by the lack of indication of a silicon PL peak at 735 nm. This gives rise to the idea of making SC-CVD diamond further colorless by applying a very small amount of boron into the reaction chamber to compensate for the silicon contamination coming from, e.g., the heated quartz component in the CVD chamber; nitrogen contamination which might come from contamination from process gas tanks, such as a methane tank (Research Grade 4.0 with 60 ppm nitrogen impurity); contamination from the vacuum sealing; contamination from chamber wall and substrate holders heated by microwave plasma.

Figure 5:
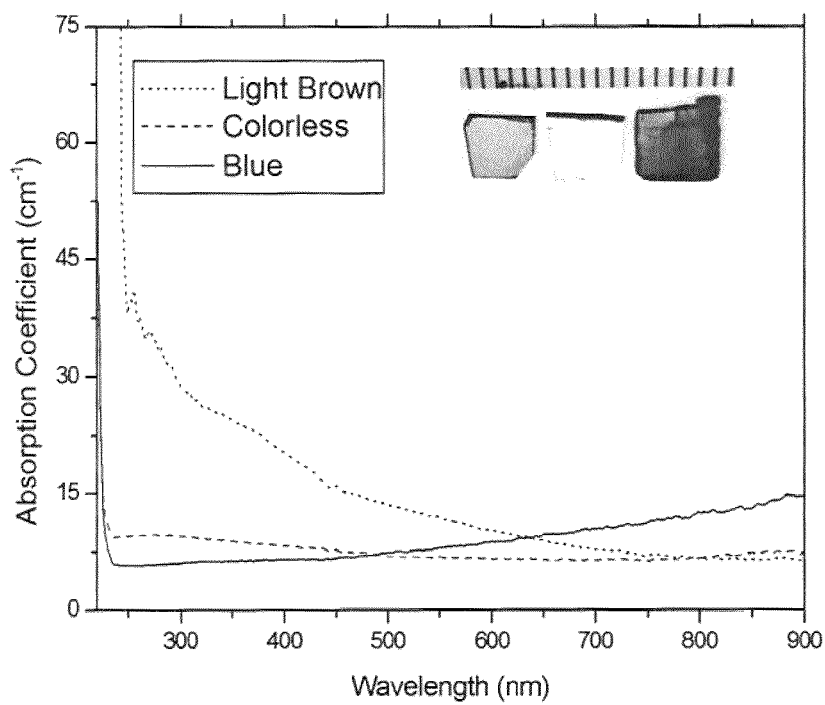
FIG. 5 provides absorption coefficient of light brown, colorless and faint blue boron doped SC-CVD diamonds.

From the UV-visible absorption spectra of FIG. 5, the brown boron doped SC-CVD diamonds exhibited a broad band around 270 nm related to substitutional nitrogen and 550 nm due to the nitrogen vacancy center (Martineau et al., Gems & Gemology, 2004). The colorless boron doped SC-CVD diamonds have a much lower background and show extremely low (or no) trace of the 270 nm and 550 nm bands. For faint blue boron doped SC-CVD diamonds, extremely low (or no) nitrogen impurity was located, and a blue hue on the spectra was observed.

Figure 6:
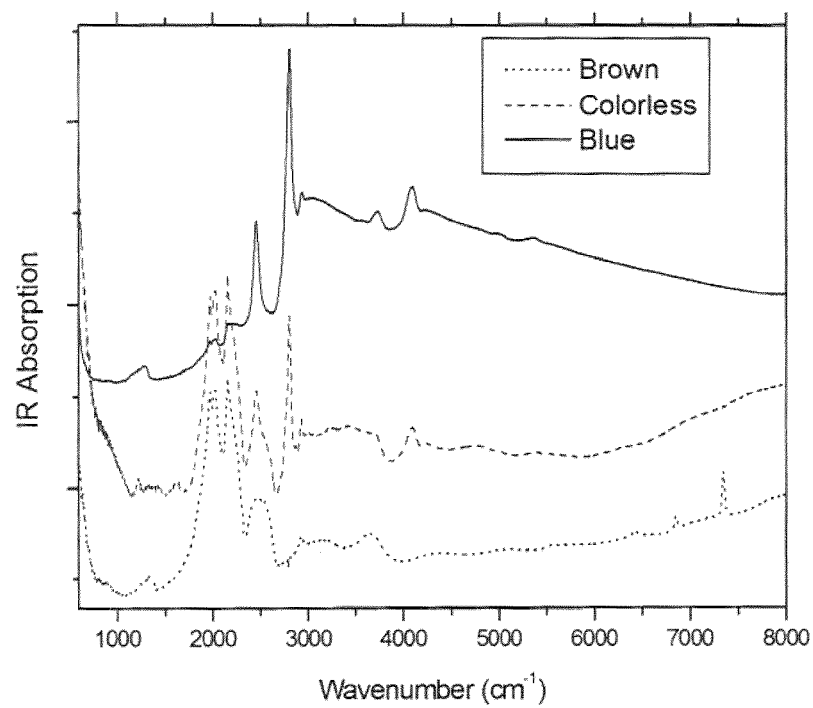
FIG. 6 provides IR spectra of light brown, colorless, and faint blue boron doped SC-CVD diamonds. The spectra are not to scale.

As seen in FIG. 6, boron incorporation is further confirmed by FTIR; absorption bands at 2800, 2457 (electronic excitations) and 1282 cm$^{-1}$ (single phonon absorption) were observed (Burns et al., J. Cryst. Growth, 1990; Prelas et al., Handbook of Industrial Diamonds and Diamond Films, Marcel Dekker, New York, USA, 1998; Gheeraert et al., Diamond and Relat. Mater., 1998). For samples with higher boron concentration, peaks at higher wavenumbers, i.e., at 3723, 4085, 5025, 5362 cm$^{-1}$, can also be observed. Boron concentration can be determined by SIMS; uncompensated boron can also be determined by the integrated intensities of absorption coefficient of peaks at 1282, 2457, 2800 cm$^{-1}$ (Prelas et al., Handbook of Industrial Diamonds and Diamond Films, Marcel Dekker, New York, USA, 1998; Gheeraert et al., Diamond and Relat. Mater., 1998). For CVD boron doped diamond films, the uncompensated boron concentration is calculated from the following equation:

$$[B](cm^{-3})=1.1\times10^{15}I(2880\ cm^{-1})\ (cm^{-2}) \quad (3)$$

Based on this equation, and the plot of toughness vs. hardness (FIG. 1), boron concentration of ultratough boron doped diamonds varies between 0 to 100 ppm. Also, boron incorporation introduced less (or even eliminated) hydrogen electronic centers over 5000 cm$^{-1}$ on IR spectra. Color improvement by boron incorporation is further confirmed by the minimization of H related IR peaks at higher wavenumbers (Meng et al., Proc. Nat. Acad. Sci. U.S.A., 2008). In another words, the brown color of CVD single crystal diamonds can be tuned by boron addition.

EXAMPLE 1

Single-crystal diamond was synthesized by high density microwave plasma chemical vapor deposition (MPCVD) at 5-20% CH$_4$/H$_2$, 0-0.2% N$_2$/CH$_4$, at 150-220 torr and at temperatures ranging from 1100° C. to 1300° C., as measured by a two-color infrared pyrometer. Hexagonal boron nitride (h-BN) powder was selected as the dopant and introduced into the CVD system. The decomposition of h-BN in the plasma system supplies a sufficient amount of boron for the doping process. A growth rate of 20-100 μm/h was recorded. After the growth, CVD layers were separated from the substrates by a Q-switched Nd:YAG laser, followed by fine polishing to remove any residual carbon. Undoped SC-CVD crystals free of visible defects in the size range of 0.2 mm to 6 mm were selected for LPHT annealing. The 6 kW 2.45 GHz MPCVD reactor was used for annealing, which was carried out with a measured diamond surface temperature 1600-2200° C. at gas pressures between 150 and 300 torr.

Quantifying mechanical properties such as fracture toughness for materials such as diamond is challenging. Historically, Vickers micro-hardness testing techniques have been used to evaluate both the hardness and fracture toughness of diamond (Novikov et al., Diam. Rel. Mater., 1993; Drory et al., Appl. Phys. Lett., 1995). However, ambiguity arises when Vickers indenters are used against material with hardness comparable or exceeding that of the indenter material (i.e., single crystal diamond). Hardness values higher than 120 GPa, in which deformation of the indenting tip occurs, are unrealistic (Brazhkin et al., Nature Materials, 2004). However, the consistency of the values obtained with other types of diamonds whose mechanical properties have been determined by a variety of approaches demonstrates that this method is capable of providing useful results. The technique also provides important comparable results used for investigating the mechanical properties of superhard materials generally (Yan et al., Phys. Stat. Sol., 2004). In the present study, an identical methodology was employed to study the hardness/toughness of boron-doped and LPHT treated SC-CVD diamond.

Hardness-fracture toughness data are plotted in FIG. 1 for natural type-Ia, type-IIa, synthetic type-Ib, SC-CVD, LPHT treated SC-CVD, and boron/nitrogen doped SC-CVD. The hardness $H_V$ is determined by the applied load P and the indentation size 2a, according to $$H_V=1.854\ P/a^2,\ a=(a_1+a_2)/2 \quad (1)$$

where the mean lengths of radial cracks propagating from the indentation corners were used to estimate the fracture toughness (Yan et al., Physica. Status Solidi., 2004; Miyata et al., J. Mater. Res., 1993; Cheesman et al., Phys. Chem. Chem. Phys., 2005)

$$K_{1C}=0.016(E/H_V)^{0.5}P/c^{1.5}, \quad (2)$$

where C is the length of radial cracks measured from the indent center, $c=(c_1+c_2)/4$, and E is the Young's modulus (Liang et al., Appl. Phys. Lett., 2003). To prevent plastic deformation, loads between 1 and 3 kg were used. To validate the indentation results, all indenters were inspected under a microscope and tested on a polished metal surface before and after each diamond indentation. All tests were performed using the same Vickers indenter instrument; natural Ia, natural IIa, synthetic Ib, and selected previous measurements on SC-CVD diamond are shown (Yan et al., Physica. Status Solidi., 2004). Although the quantification of the hardness/toughness values for comparison with the results of other types of measurements require detailed analysis (Prelas et al., Handbook of Industrial Diamonds and Diamond Films, Marcel Dekker, New York, USA, 1998; Hemley et al., U.S. Patent Application Publication No. 2006065187) the dataset provides a quantitative relative measure of hardness/toughness for the diamond materials studied here.

The type Ia and IIa diamonds measured here have $K_{1C}$ values of 8(±4) MPa m$^{1/2}$, and that of type I-b synthetic diamond is 10 (±2) MPa m$^{1/2}$. Without boron doping, SC-CVD diamond grown with. H$_2$/CH$_4$/N$_2$ chemistry has a Vickers-based fracture toughness measure of 15 (±5) MPa m$^{1/2}$, 50% higher than type I-b synthetic diamond. In contrast, the calculated fracture toughness of the boron doped. SC-CVD diamond is higher than 22 MPa m$^{1/2}$. This material has highly enhanced fracture toughness on this scale compared with values obtained on undoped SC-CVD diamond, without compromising the hardness [78 (±12) GPa].

Figure 2:
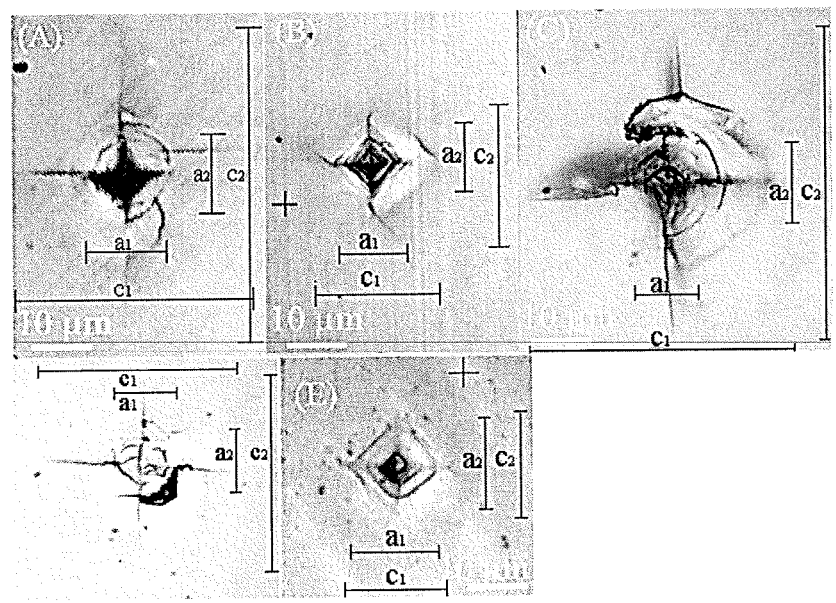
FIG. 2 depicts indentation patterns for various diamonds.

It is recognized that the strongest bonding in diamond lies along {100} direction, with {111} plane being the cleavage plane (Chrenko, Physical Review, 1973). For the crystals measured in this study, cross-like cracks along {100}, {111}, and {110} directions were only observed in natural and type-Ib crystals. For SC-CVD (as-grown and annealed), the indentation marks exhibit square crack patterns along the softer {110} and {111} directions. However, for a number of boron/nitrogen doped diamond specimens, there is a complete lack of a trace of cracking along the indentation craters. This remarkable result appears not to have been previously reported for diamond (FIG. 2). The observation obviously precludes quantification of the fracture toughness using the Vickers technique. Indeed, it may be argued that quantitative measurements on materials having fracture toughness higher than 30 MPa m$^{1/2}$ exceed the limit of indentation techniques. Nevertheless, we emphasize that the behavior of the diamond material studied here is qualitatively different.

The measurements further reveal that the LPHT annealed SC-CVD exhibits ultrahard characteristics (measured hardness of at least ~125 GPa) without an appreciable reduction in toughness ($K_{1C}$=12-16 MPa m$^{1/2}$). This contrasts with the results obtained previously for SC-CVD subjected to high pressure/high temperature (HPHT) annealing (Yan et al., Phys. Stat. Sal., 2004). Recently, annealing studies of these diamonds under low pressure/high temperature (LPHT) conditions (>1600° C., <300 torr; i.e., outside the diamond stable field) revealed major changes in optical properties, including decreases in visible absorption (Meng et al., Proc. Nat. Mad. Sci. U.S.A., 2008). Diamond surface toughening processes have been reported by ion-implantation (Anderson et al., Nucl. Methods Phys. Res., 1993) or surface thermal diffusion (Meng et al., U.S. Pat. No. 6,322,891). All CVD diamond crystals examined in this study were extensively polished prior to indentation, which demonstrates that the toughness enhancement is a bulk property. Additional evidence that LPHT treated SC-CVD material possesses superior hardness is that the Vickers indenters typically cracked after ~10 measurements for doped SC-CVD, but after only 1-2 indentations for the annealed diamond crystals.

Figure 7:
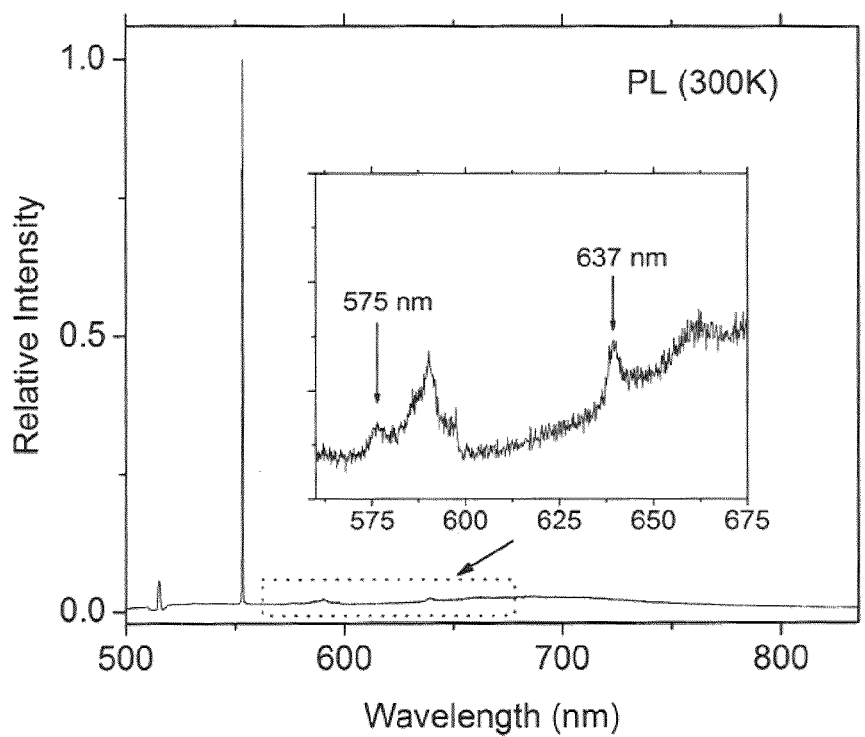
FIG. 7 provides a photoluminescence spectrum of a boron/nitrogen doped single-crystal CVD diamond.
Figure 8:
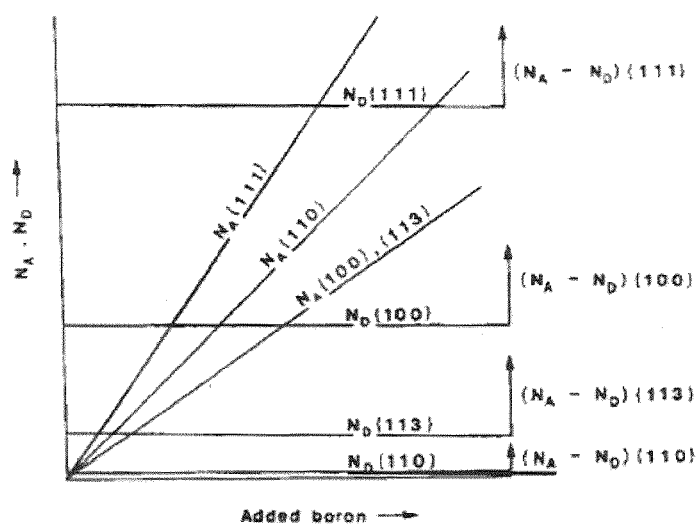
FIG. 8 provides a modified Kanda diagram, wherein horizontal lines represent the relative concentration of nitrogen donors (ND) in each type of growth sector, inclined lines represent the concentration of boron acceptors, NA, in each type of growth sector as a function of the amount of boron dopant added to the synthesis capsule. See Reference (Burns et al., J. Cryst. Growth, 1990).

A representative photoluminescence spectra and images of the diamond material studied are shown in FIG. 7. High quality diamond crystals exhibit the prominent second-order Raman feature. The bands assigned to NV$^0$ centers around 575 nm and NV$^-$ centers around 637 nm demonstrate the incorporation of nitrogen in the diamond structure. Changes in infrared spectra after LPHT annealing were similar to those found after HPHT processing (Meng et al., Proc. Nat. Acad. Sci. U.S.A., 2008). Without being bound by theory, measurements to date lead the inventors to propose that the interaction among nitrogen, boron and adjacent carbon atoms give rise to the enhanced toughness.

On the basis of the present results, it is suggested that the enhanced optical and mechanical properties of the diamond materials described here may find useful applications as optical windows in harsh environments, mechanical testing, abrasive machining, laser optics, and transparent shielding and MEMS devices. The low cost, large area LPHT annealing process may be an alternative, to HPHT annealing and could have important industrial applications.

Examples of applications of ultratough boron doped diamonds include, but are not limited to, the following: non-ferrous materials machining, micromachining and nanomachining (graphite, high silicon alloy machining in automotive industry); rock/oil drilling where extremely high toughness diamonds are needed; high pressure anvils with tunable conductivity and higher toughness to carry on high pressure limits; and high temperature and severe environment electro sensors. The high toughness of the boron doped diamonds also makes them a potential candidate for titanium machining for aerospace industry.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

Cited References:
1. Anderson et al., Nucl. Methods Phys. Res. B 80-81, 1451 (1993)
2. Anstis et al., J. Am. Ceram. Soc. 64, 533 (1981)
3. Anthony et al., Diam. Rel. Mater. 6, 120 (1997)
4. Arima et al., "Effects of vicinal angles from (0 0 1) surface on the Boron-doping features of high-quality homoepitaxial diamond films grown by the high-power microwave plasma chemical-vapor-deposition method", J. Crys. Growth, 309, pp 145-152 (2007)
5. Brazhkin et al., "From our readers: What does 'harder than diamond' mean?" Nature Materials, 3(9), 576 (2004)
6. Burns "Growth-Sector Dependence of Optical Features in Large Synthetic Diamonds", Journal of Crystal Growth", J. Cryst. Growth, 104, 257-279 (1990)
7. Charles et al., "Characterization of nitrogen doped chemical vapor deposited single crystal diamond before and after high pressure, high temperature annealing", Phys. Stat. Sol., 201(11), 2473-2485 (2004)
8. Cheesman et al., "Computational studies of elementary steps relating to boron doping during diamond chemical vapour deposition", Phys. Chem. Chem. Phys., 7, 1121-1126 (2005)
9. Chrenko et al., "Boron, the Dominant Acceptor in Semiconducting Diamond", Physical Review, 7(10), 456-4567, (1973)
10. Davies et al., "The toughness of free-standing CVD diamond", J. Mater. Sci., 39(5), 1571-1574 (2004)
11. Drory et al., "Fracture of Synthetic Diamond", Appl. Phys. Lett. 78, 3083 (1995)
12. Gheeraert et al., Diamond and Relat. Mater., 7, 1509 (1998)
13. Hemlcy et al., U.S. Patent Application Publication No. 20060065187
14. Jiang et al., "Accurate measurement of fracture toughness of free standing diamond films by three-point bending tests with sharp pre-cracked specimens", Diam. Rel. Mater., 9, 1734-1738 (2000)
15. Liang et al., "Effect of nitrogen addition on the morphology and structure of boron-doped nanostructured diamond films", Appl. Phys. Leti, 83, 5047 (2003)
16. Liang, C. S. Yan, Y. F. Meng, J. Lai, S. Krasnicki, N. K. Mao and R. J. Hemley, to be published.

17. Liang et al., "Enhanced growth of high quality single crystal diamond by microwave plasma assisted chemical vapor deposition at high gas pressures", Appl. Phys. Lett., 94, 024103 (2009)
18. Locher R, Wagner J., Fuchs F., Maier M., Gonon P., Koidl P., Diamond Relat. Mater. 4, 678 (1995)
19. Martineau et al., "Identification of synthetic diamond grown using chemical vapor deposition (CVD)", Gems & Gemology, 60, 2-25 (2004)
20. Meng et al., U.S. Pat. No. 6,322,891 (2001)
21. Meng et al., "From the Cover: Enhanced optical properties of chemical vapor deposited single crystal diamond by low-pressure/high-temperature annealing", Proc. Nat. Acad. Sci. U.S.A. 105(46), 17620 (2008)
22. Miyata et al., "Morphology of heavily B-doped diamond films", J. Mater. Res., 8(11), 2845-2857 (1993)
23. Mora et al., "Direct evidence of interaction between dislocations and point defects in diamond", Phys. Stat. Sol., 202, R69-R71 (2005)
24. Novikov et al., J. Hard. Mater., 4(1), 19-27 (1993)
25. Novikov et al., "Mechanical properties of diamond and cubic BN at different temperatures and deformation rates", Diam. Rel. Mater., 2, 1253-1256 (1993)
26. Patridge et al., "Potential for diamond fibres and diamond fibre composites", Materials Science and Technology, 10, 505-512 (1994)
27. Prelas et al., Handbook of Industrial Diamonds and Diamond Films, Marcel Dekker, New York, USA (1998)
28. Prelas, G. Popovici, and L. K. Bigelow, Handbook of Industrial Diamonds and Diamond Films (Marcel Dekker, New York, USA 1998)
29. Quinn et al., J. Am. Ceram. Soc. 90(3), 673 (2007)
30. Show et al., "changes in CVD diamond film by boron and nitrogen doping", Diamond Relat. Mater., 9, pp 337-340 (2000)
31. Sumiya et al., "Indentation hardness of nano-polycrystalline diamond prepared from graphite by direct conversion", Diam. Rel. Mater., 13(10), 1771-1776 (2004)
32. Telling et al., "Theoretical Strength and Cleavage of Diamond", Phys Rev. Lett., 84, 5160-5163 (2000)
33. Vornov et al., Neorganicheskie Materialy, 29(5), pp 543 (1993)
34. Wentorf et al., "Sintered Superhard Materials", Science, 208(4446), 873-880 (1980)
35. Yan et al., "Very high growth rate chemical vapor deposition of single-crystal diamond", Proceedings of the National Academy of Science, 99 (20), R25-R27 (2002)
36. Yan et al., "Ultrahard diamond single crystals from chemical vapor deposition", Phys. Stat. Sol., 201(4), R25-R27 (2004)
37. Yan et al., "Very high growth rate chemical vapor deposition of single-crystal diamond", Proceedings of the National Academy of Science, 99, 12523-12525 (2002)

What is claimed is:

1. A method for growing single-crystal boron doped diamond of high toughness comprising:
   i) placing a seed diamond in a heat sink holder made of a material that has a high melting point and high thermal conductivity to minimize temperature gradients across the growth surface of the diamond;
   ii) controlling the temperature of a growth surface of the diamond such that the temperature of the growing diamond crystals is in the range of 1100-1300° C.; and
   iii) growing single-crystal diamond by microwave plasma chemical vapor deposition on the growth surface of a diamond in a deposition chamber comprising 5-20% $CH_4/H_2$, 5-20% $O_2/CH_4$, 0-0.2% $N_2/CH_4$ and a source of boron,
   wherein the growth rate of the diamond is from about 20-100 μm/h,
   wherein the orientation of the single-crystal diamond seed is 1-15 degrees off of the {100} plane,
   wherein the as-grown diamond is substantially free of silicon in the diamond structure,
   wherein the pressure in the deposition chamber is from 150 to 220 torr; and
   wherein the toughness of the as-grown diamond is in the range of 22-35 MPa $m^{1/2}$.

2. The method of claim 1, wherein the source of boron is diborane, hexagonal boron nitride powder, a trimethyl borate gas, vaporized $B_2O_3$, or mixtures thereof.

3. The method of claim 1, further comprising annealing the single-crystal diamond.

4. The method of claim 1, wherein the heat sink holder is made of molybdenum.

5. The method of claim 1, wherein the source of $O_2$ is carbon monoxide, carbon dioxide, water vapor or mixtures thereof.

6. A single-crystal boron-doped diamond grown by microwave plasma chemical vapor deposition that has a toughness in the range of 22-35 MPa $m^{1/2}$ and is grown by a method comprising:
   i) placing a seed diamond in a heat sink holder made of a material that has a high melting point and high thermal conductivity to minimize temperature gradients across the growth surface of the diamond;
   ii) controlling the temperature of a growth surface of the diamond such that the temperature of the growing diamond crystals is in the range of about 1100-1300 ° C.; and
   iii) growing single-crystal diamond by microwave plasma chemical vapor deposition on the growth surface of a diamond in a deposition chamber comprising 5-20% $CH_4/H_2$, 5-20% $O_2/CH_4$, 0-0.2% $N_2/CH_4$ and a source of boron,
   wherein the growth rate of the diamond is from about 20-100 μm/h,
   wherein the orientation of the single-crystal diamond seed is 1-15 degrees off of the {100} plane,
   wherein the pressure in the deposition chamber is from 150 to 220 torr; and
   and wherein the as-grown diamond is substantially free of silicon in the diamond structure.

* * * * *